United States Patent
Yu et al.

(10) Patent No.: US 6,339,029 B1
(45) Date of Patent: Jan. 15, 2002

(54) METHOD TO FORM COPPER INTERCONNECTS

(75) Inventors: Chen-Hua Yu; Mong-Song Liang, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/487,453

(22) Filed: Jan. 19, 2000

(51) Int. Cl.[7] ............................................. H01L 21/302
(52) U.S. Cl. ...................... 438/712; 438/720; 438/724
(58) Field of Search ................................. 438/633–637, 438/643–645, 654, 674, 699, 681–687, 712, 706, 717, 720, 722, 723, 724

(56) References Cited

U.S. PATENT DOCUMENTS

| | | | |
|---|---|---|---|
| 4,931,410 A | 6/1990 | Tokunaga et al. ............ | 437/189 |
| 5,060,050 A | 10/1991 | Tsuneoka et al. ............. | 357/71 |
| 5,420,069 A | 5/1995 | Joshi et al. ................. | 437/187 |
| 5,539,256 A * | 7/1996 | Migaki ........................ | 257/763 |
| 5,731,245 A | 3/1998 | Joshi et al. ................. | 438/705 |
| 5,780,908 A * | 7/1998 | Sekiguchi et al. .......... | 257/383 |
| 5,824,599 A | 10/1998 | Schacham-Diamand et al. . | 438/678 |
| 5,891,513 A * | 4/1999 | Dubin et al. ................. | 438/631 |
| 5,969,422 A * | 10/1999 | Ting et al. ................... | 257/762 |
| 6,015,749 A * | 1/2000 | Liu et al. .................... | 438/628 |
| 6,046,108 A * | 4/2000 | Liu et al. .................... | 438/687 |

* cited by examiner

*Primary Examiner*—Benjamin L. Utech
*Assistant Examiner*—Duy-Vu Deo
(74) *Attorney, Agent, or Firm*—George O. Saile; Stephen B. Ackerman; Rosemary L. S. Pike (57) ABSTRACT

A method to form copper interconnects is described. A substrate layer is provided. A first intermetal dielectric layer is deposited overlying the substrate layer. A barrier layer is deposited overlying the first dielectric layer. A thin copper seed layer is deposited overlying the barrier layer. A copper layer is deposited by electrochemical deposition where the copper seed layer initiates the copper layer deposition and where the copper layer is deposited overlying the barrier layer. The copper layer is annealed. The copper layer and the barrier layer are etched through to the underlying first dielectric layer where the copper layer is not protected by a photoresist mask and where the etching through forms conductive traces. A passivation layer composed of a copper-germanium alloy is formed in the exposed surfaces of the copper layer to complete the conductive traces. A second intermetal dielectric layer is deposited overlying the conductive traces and the first dielectric layer to complete the fabrication of the integrated circuit device.

20 Claims, 6 Drawing Sheets

METHOD TO FORM COPPER INTERCONNECTS

BACKGROUND OF THE INVENTION (1) Field of the Invention

The present invention relates to the fabrication of semiconductor structures, and more particularly, to a method to fabricate copper interconnects in the manufacture of integrated circuits.

(2) Description of the Prior Art

As integrated circuit feature sizes continue to decrease, it has become advantageous to construct metal connections out of copper instead of aluminum. Copper has a lower resistivity than aluminum, and therefore can form higher speed connections for a given line width.

The disadvantage of copper, however, is that it is more difficult to reliably etch than aluminum. To create copper traces, therefore, alternative design approaches such as damascene and dual damascene structures have been employed. By using damascene techniques, copper line etches are eliminated. Instead, trenches are first cut into the isolation dielectric material where connective traces are planned. Then the copper is deposited to fill the traces. A polishing process is then used to etch back any overfill of copper in the trenches. In this way, damascene approaches allow the use of copper for interconnects.

Figure 1:
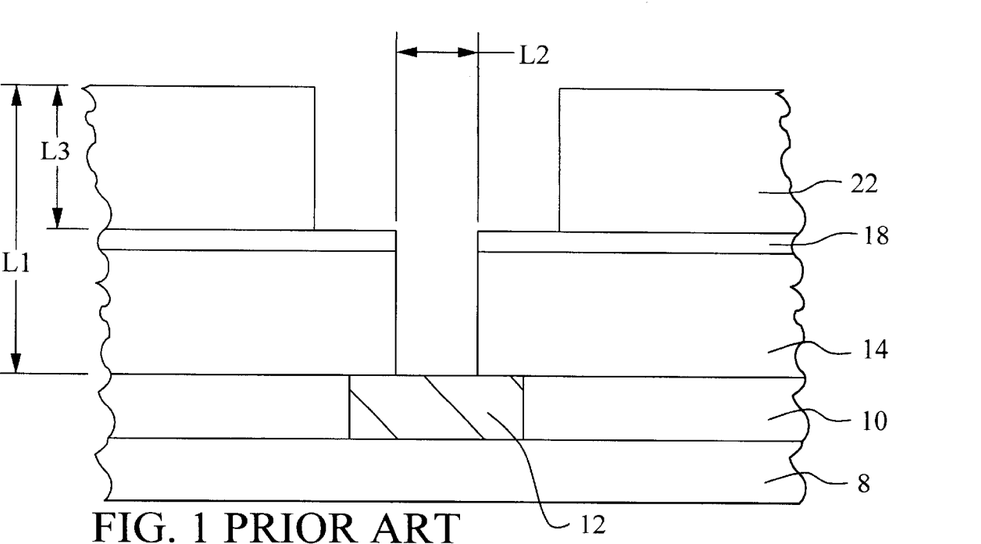
FIGS. 1 and 2 schematically illustrate in cross-section partially completed prior art integrated circuits using copper interconnect structures.

As practiced in the art, the copper interconnect processes that use damascene and dual damascene techniques experience several problems. Referring to FIG. 1, a cross-section of a partially completed prior art dual damascene structure is shown. A substrate layer 8 is depicted. The substrate layer 8 encompasses all underlying layers, devices, junctions, and other features that have been formed prior to the deposition and definition of the conductive plugs 12 in the isolation layer 10. A first intermetal dielectric layer 14 overlies the isolation layer 10 and partially overlies the conductive plug 12. An etch stopping layer 18 overlies the first intermetal dielectric layer 14. A second intermetal dielectric layer 22 overlies the etch stopping layer 18.

A via opening is shown formed in the first intermetal dielectric layer 14 to expose the top surface of the conductive plug 12. The via opening has a width L2. A metal interconnect opening is shown formed in the second intermetal dielectric layer 22. The metal interconnect opening has a depth of L3. The total depth of the dual damascene opening is L1.

Several problems can be illustrated regarding the prior art dual damascene structure shown in FIG. 1. First, the via opening is typically etched through both the first and second intermetal dielectrics, 14 and 22 respectively. This means that a large aspect ratio (L1/L2) etch must be made. It is difficult to make such etches uniformly in the production process. In addition, it is difficult to properly clean the etch opening after the etch process. Second, in the prior art structure, the etch stopping layer 18 must be used to control the depth of the metal interconnect trench. The etch stopping layer 18 is typically composed of silicon oxynitride. Unfortunately, silicon oxynitride has a relatively large dielectric constant when compared to the oxide material used in the dielectric layers. This means that the etch stopping layer 18 has the disadvantage of adding to the capacitance loading on the metal interconnect lines formed by this method.

The third disadvantage of the typical prior art dual damascene structure is the difficulty of filling the structure with the copper metal without creating gaps or voids. Even with the benefit of the stair step profile of the dual trenches, it is still difficult to properly fill the structure using physical vapor deposition (PVD) or chemical vapor deposition processes (CVD).

Figure 2:
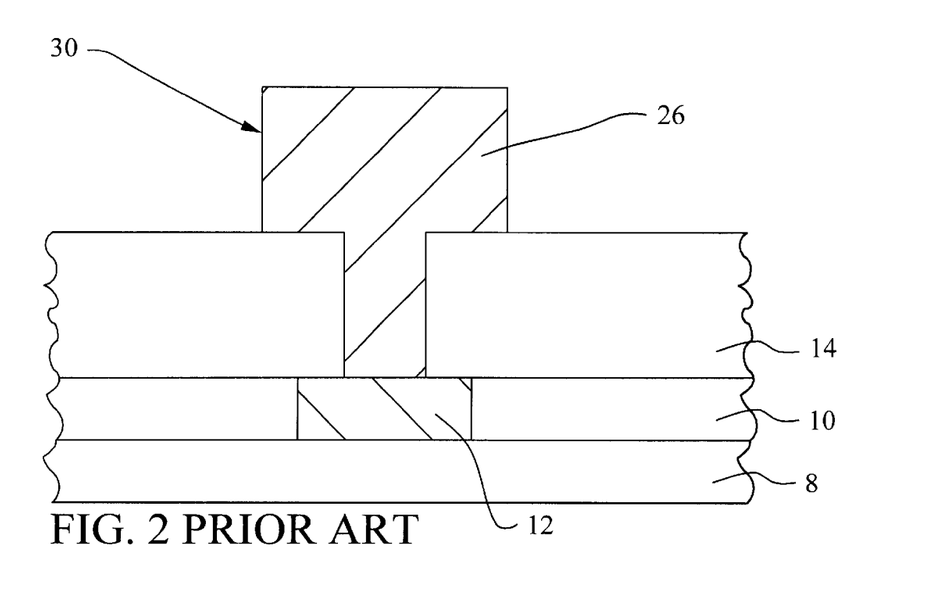

Referring now to FIG. 2, another approach to copper metalization is shown. Prior to the development of dual damascene techniques, the traditional metal deposit and etch technique was used to form metal interconnections with aluminum or aluminum alloys. In FIG. 2, a layer of copper metal 26 is shown deposited and etched to form connective features. The problem with using copper instead aluminum in this approach is the difficulty of etching copper deposited by PVD or CVD with reactive ion etching (RIE). Additionally, exposed copper surfaces 30 are very susceptible to corrosion during subsequent semiconductor processing. Etching difficulty and corrosion problems are the reasons dual damascene has become common in the art for copper metalization. However, dual damascene processing is complex and expensive. In addition, as seen in the earlier discussion, several problems exist in the dual damascene approach.

Several prior art approaches attempt to improve the viability of copper metalization. U.S. Pat. No. 5,731,245 to Joshi et al teaches the formation of copper-germanium alloys to improve the characteristics of soft metal and metal alloys. U.S. Pat. No. 5,420,069 to Joshi et al discloses a process to form a corrosion resistant layer of $Cu_xGe_y$ overlying a copper conductor using a germanium gas source in a chemical vapor deposition chamber. U.S. Pat. No. 5,060,050 to Tsuneoka et al teaches a copper layer covered by an impurity diffusion-preventing layer. U.S. Pat. No. 4,931,410 to Tokunaga et al discloses a patterned copper interconnect process. U.S. Pat. No. 5,824,599 to Schacham-Diamond et al teaches an electroless copper deposition process to form copper interconnects. This process features a protective aluminum layer and uses chemical mechanical polishing to define the copper connections.

SUMMARY OF THE INVENTION

A principal object of the present invention is to provide an effective and very manufacturable method of fabricating integrated circuits with copper interconnects.

A further object of the present invention is to provide a method of fabricating copper interconnects using electrochemical deposition of copper to improve the etching capability of the copper.

Another further object of the present invention is to provide a method of fabricating copper interconnects where a copper-germanium alloy passivation layer is formed over the exposed copper surfaces to prevent corrosion.

In accordance with the objects of this invention, a new method of fabricating an integrated circuit using copper interconnects is achieved. A substrate layer is provided encompassing all underlying layers, devices, and junctions. Conductive plugs are provided in an isolating dielectric layer. A first intermetal dielectric layer is deposited overlying the conductive plugs and the isolating dielectric layer. The first dielectric layer is etched through to the underlying conductive plugs where the first dielectric layer is not protected by a first photoresist mask and where the etching through forms via trenches. A barrier layer is deposited overlying the first dielectric layer and the exposed conductive plugs. A thin copper seed layer is deposited overlying the barrier layer. A copper layer is deposited by electrochemical deposition where the copper seed layer initiates the copper layer deposition, where the copper layer is deposited overlying the barrier layer, and where the copper layer completely fills the via trenches. The copper layer is annealed. An optional dielectric barrier layer is deposited overlying the copper layer. The dielectric barrier layer is etched through to the underlying copper layer where the dielectric barrier layer is not protected by a second photoresist mask and thereby forms a hard mask for the copper layer etch. The copper layer and the barrier layer are etched through to the underlying first dielectric layer where the copper layer is not protected by the dielectric barrier layer hard mask, where the etching through forms conductive traces, and where the dielectric barrier layer hard mask, the copper layer, and the barrier layer are left overlying all of the via trenches. A passivation layer composed of a copper-germanium alloy is formed in the exposed surfaces of the copper layer to complete the conductive traces. A second intermetal dielectric layer is deposited overlying the conductive traces and the first dielectric layer to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 3:
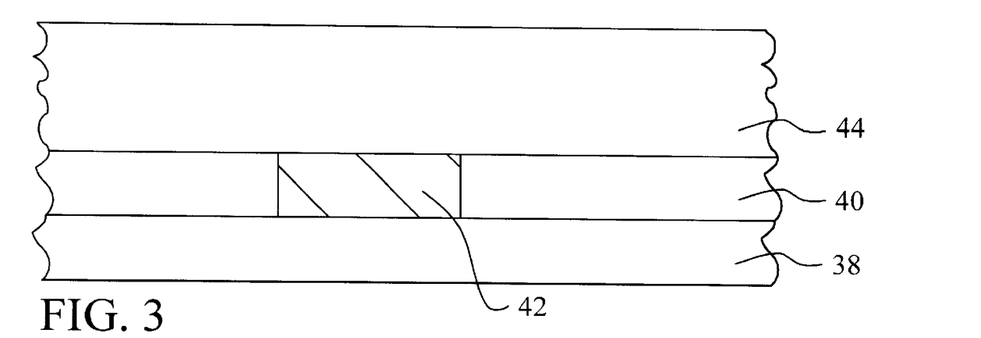
FIGS. 3 through 11 schematically illustrate in cross-sectional representation the present invention used to create copper interconnects.

Referring now more particularly to FIG. 3, there is illustrated a portion of a partially completed integrated circuit. In this preferred embodiment, the present invention will be used to create copper interconnects. It will be understood by those skilled in the art that the invention could be applied to the formation of other copper structures. Substrate 38 encompasses all underlying layers, devices, junctions, and other features that have been formed prior to the deposition of an isolation layer 40. Conductive plugs 42 are provided in the isolation layer 40 as conventional in the art. A first intermetal dielectric layer 44 is deposited overlying the conductive plugs and the isolating dielectric layer. The first intermetal dielectric layer 44 is preferably composed of an oxide such as a low k-value fluorinated silicate glass (FSG) which is planarized after deposition. Preferably, the first intermetal dielectric layer 44 is deposited to a thickness of between about 1,000 Angstroms and 10,000 Angstroms.

Figure 4:
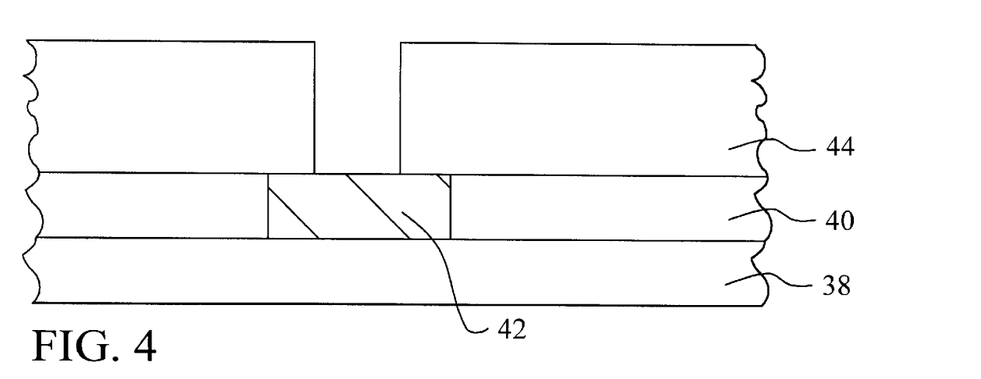

Referring now to FIG. 4, the first dielectric layer 44 is etched through to the underlying conductive plugs 42 where the first dielectric layer 44 is not protected by a first photoresist mask which is not shown. This etching step forms the via trenches. The via trench is etched by a conventional reactive ion etch (RIE). Note that this step mimics the conventional interconnect process shown in FIG. 2. In the present invention, it is not necessary to use the expensive and complex dual damascene structure to achieve copper interconnects.

Figure 5:
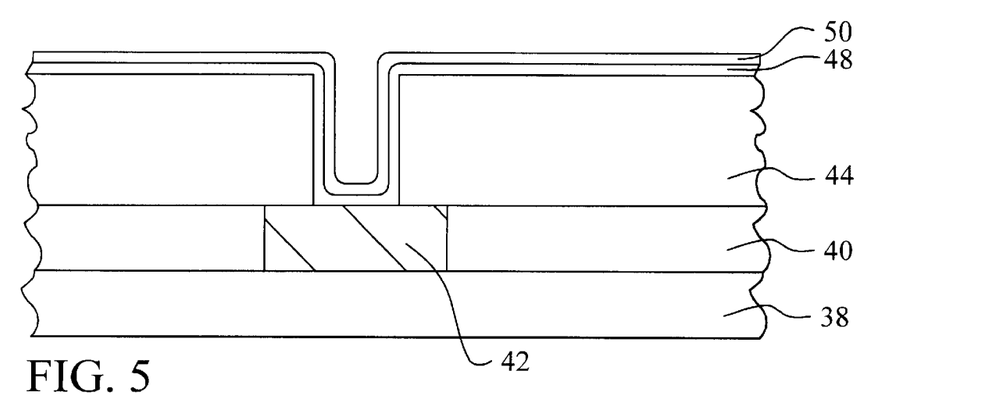

Referring now to FIG. 5, a barrier layer 48 is deposited overlying the first dielectric layer 44 and the exposed conductive plugs 42. The barrier layer 48 is typically composed of titanium nitride (TiN), tantalum (Ta), or tantalum nitride (TaN). This barrier layer 48 prevents oxidation of the subsequently deposited copper metal layer. The barrier layer is preferably deposited to thickness of between about 150 Angstroms and 500 Angstroms.

A thin copper seed layer 50 is deposited overlying the barrier layer 48. The purpose of the copper seed layer 50 is to act as a catalyst to initiate the formation of the copper layer during the subsequent electrochemical deposition step. Note that, if the copper layer 52 is subsequently deposited by either physical vapor deposition (PVD) or by chemical vapor deposition (CVD), then the thin copper seed layer 50 is not needed. The copper seed layer 50 is formed by physical vapor deposition (PVD), or sputtering, to a thickness of between about 200 Angstroms and 2,000 Angstroms.

Figure 6:
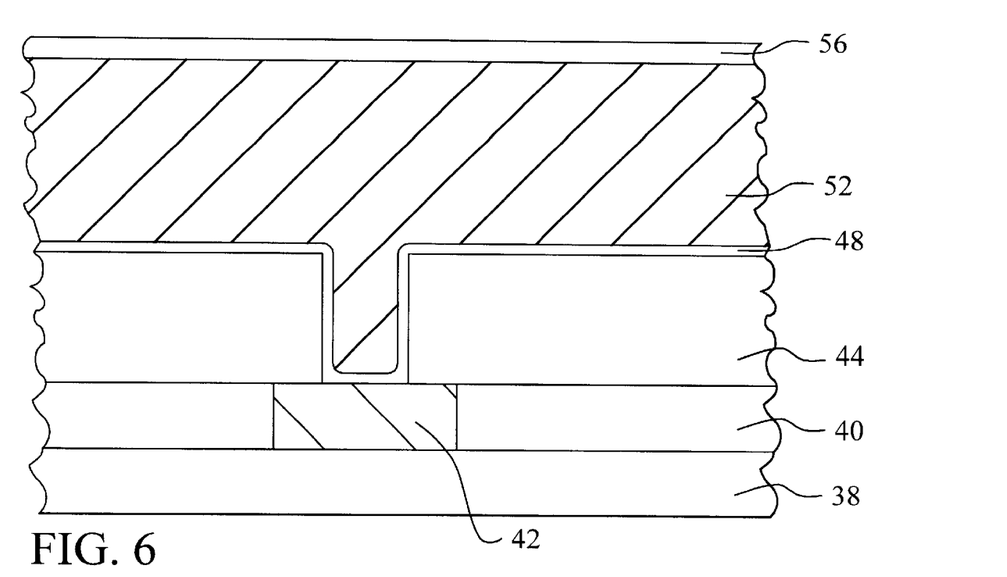

Referring to FIG. 6, an important feature of the present invention is presented. A copper layer 52 is deposited by electrochemical deposition (ECD). By using ECD, the copper layer 52 so formed is of higher quality and is easier to successfully etch using RIE etching. In addition, electrochemical deposition equipment is less expensive to own and to operate than comparable PVD or CVD equipment.

The copper layer 52 deposition can be performed in a copper containing solution in an electrochemical deposition machine. Alternatively, CVD or PVD may be used to deposit the copper layer 52. If the deposition is by electrochemical deposition, the copper seed layer 50 initiates the copper layer 52 deposition and is incorporated into the structure of the copper layer 52 so formed. The resulting copper layer 52 is deposited overlying the barrier layer 48 and completely fills the via trenches. The copper layer 52 is deposited to a thickness of between about 2,000 Angstroms and 10,000 Angstroms. Notice that the copper must only fill the via trench. In the prior art example of FIG. 1, the copper must fill both a via trench and a metal interconnect trench. This gives the present invention technique an advantage in achieving gap-free fills. In the preferred embodiment, the copper containing solution is composed of $CuSO_4$ and commercially available organic chemicals with proprietary compositions.

The copper layer 52 is annealed. The annealing step is performed at a temperature of between about 150 degrees C. and 400 degrees C. for between about 2 minutes and 30 minutes.

An optional part of the present invention is now described. At this point in the invention process, a dielectric barrier layer 56 is deposited overlying the copper layer 52. The dielectric barrier layer 56 serves two purposes. First, it provides an electrical isolation layer for the top surface of the copper. Second, it serves as a hard mask for the subsequent etch of the copper layer 52. The dielectric barrier layer 56 is preferably composed of silicon nitride conventionally deposited to a thickness of between about 300 Angstroms and 2,000 Angstroms.

Figure 7:
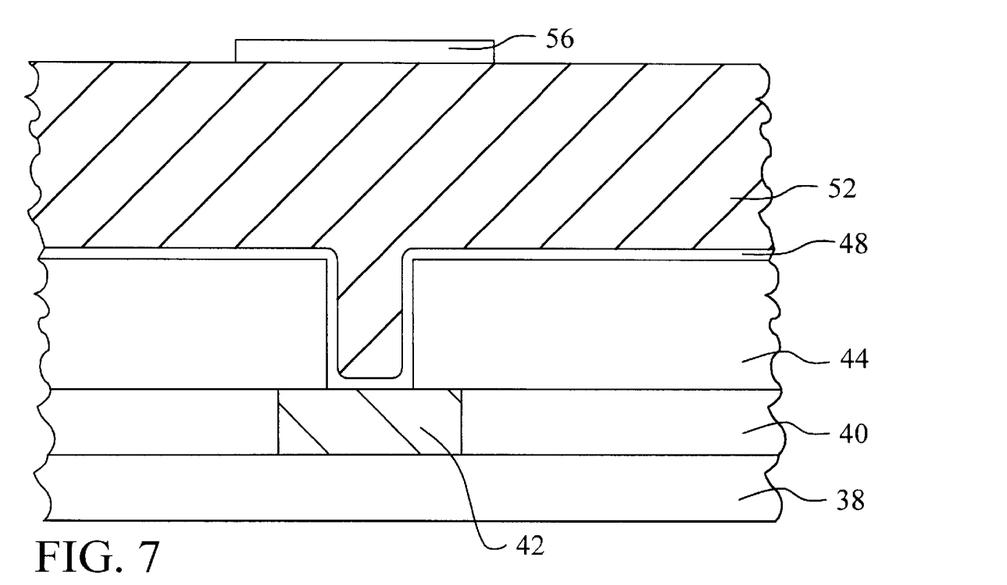

FIG. 7 shows the use of the optional dielectric barrier layer 56 as a hard mask. The dielectric barrier layer is etched through to the underlying copper layer 52 where the dielectric barrier layer 56 is not protected by a second photoresist mask that is not shown. The remaining dielectric barrier layer 56 forms a hard mask for the copper layer 52 etching step.

Figure 8:
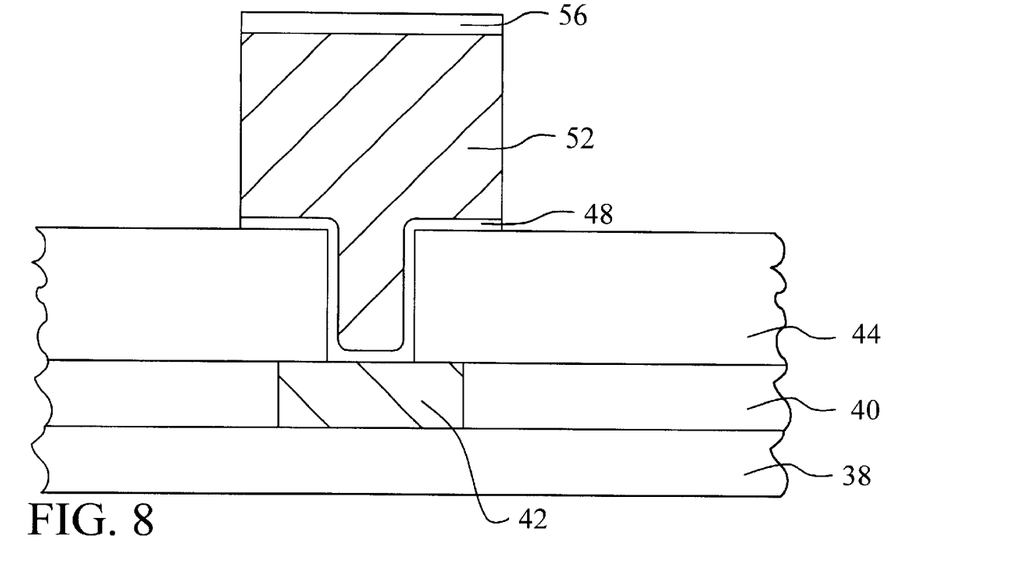

Referring now to FIG. 8, the copper layer 52 and the barrier layer 48 are etched through to the underlying first dielectric layer 44 where the copper layer 52 is not protected by the dielectric barrier layer hard mask 56. If the dielectric barrier layer 56 is not used, a second photoresist layer, which is not shown, forms the mask for the copper layer 52 etching step. The copper etch forms the conductive traces. Following the etch, the dielectric barrier layer 56 (if used), the copper layer 52, and the barrier layer 48 are left overlying all of the via trenches as shown. The copper etch is accomplished by a reactive ion etching process using a conventional etching chemistry.

Figure 9:
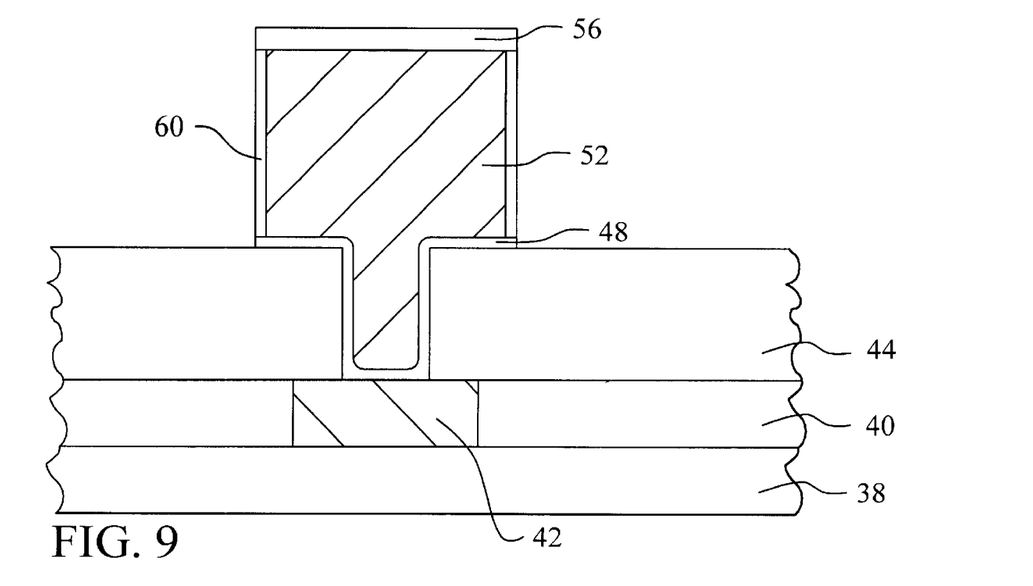

Referring now to FIG. 9, another important aspect of the present invention is described. A passivation layer 60 composed of a copper-germanium alloy ($Cu_xGe_y$) is formed on the exposed sidewall surfaces of the copper layer 52 to complete the conductive traces. The purpose of the passivation layer 60 is to prevent corrosion of the copper layer 52 during subsequent integrated circuit processing. The passivation layer 60 is formed by exposing the copper layer 52 surfaces to a source of germanium, such as $GeH_4$ gas or $Ge_2H_6$ gas in a low temperature annealing operation. In the preferred embodiment, GeH4 gas is flowed at a pressure of between about 5 Torr and 760 Torr and a temperature of between about 200 degrees C. and 400 degrees C. The resulting passivation layer 60 formed in the surface of the exposed copper layer 52 is a copper-germanium alloy formed to a depth of between about 100 Angstroms and 1,000 Angstroms.

Figure 10:
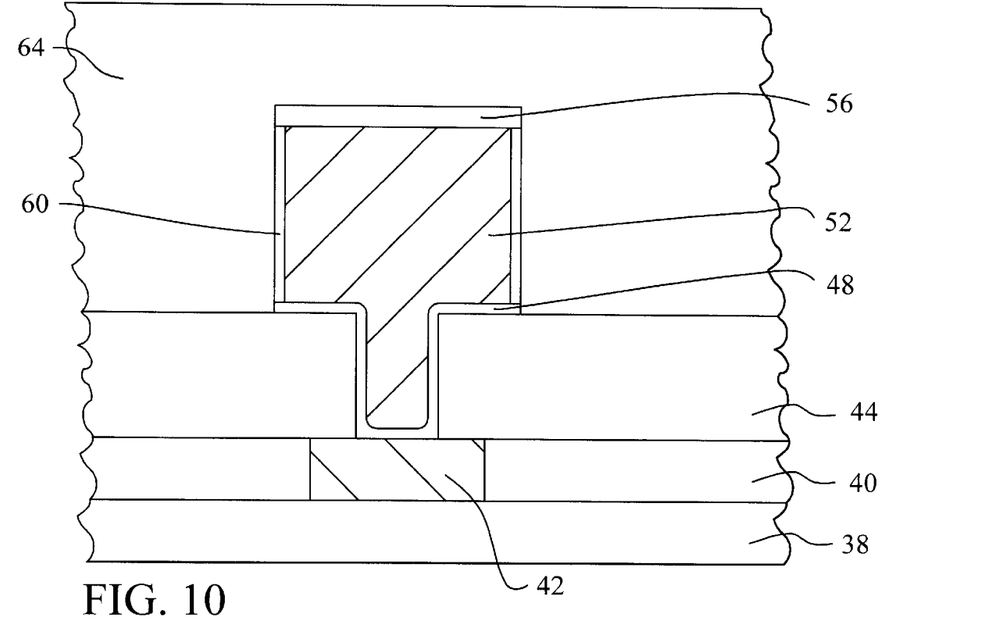

Referring to FIG. 10, a second intermetal dielectric layer 64 is deposited overlying the conductive traces and the first dielectric layer 44. The second intermetal dielectric layer 64 is preferably composed of an oxide, such as a low k-value fluorinated silicate glass (FSG), which is planarized after deposition. If the copper interconnect so formed are the uppermost metal level, this step completes the fabrication of the integrated circuit device.

Figure 11:
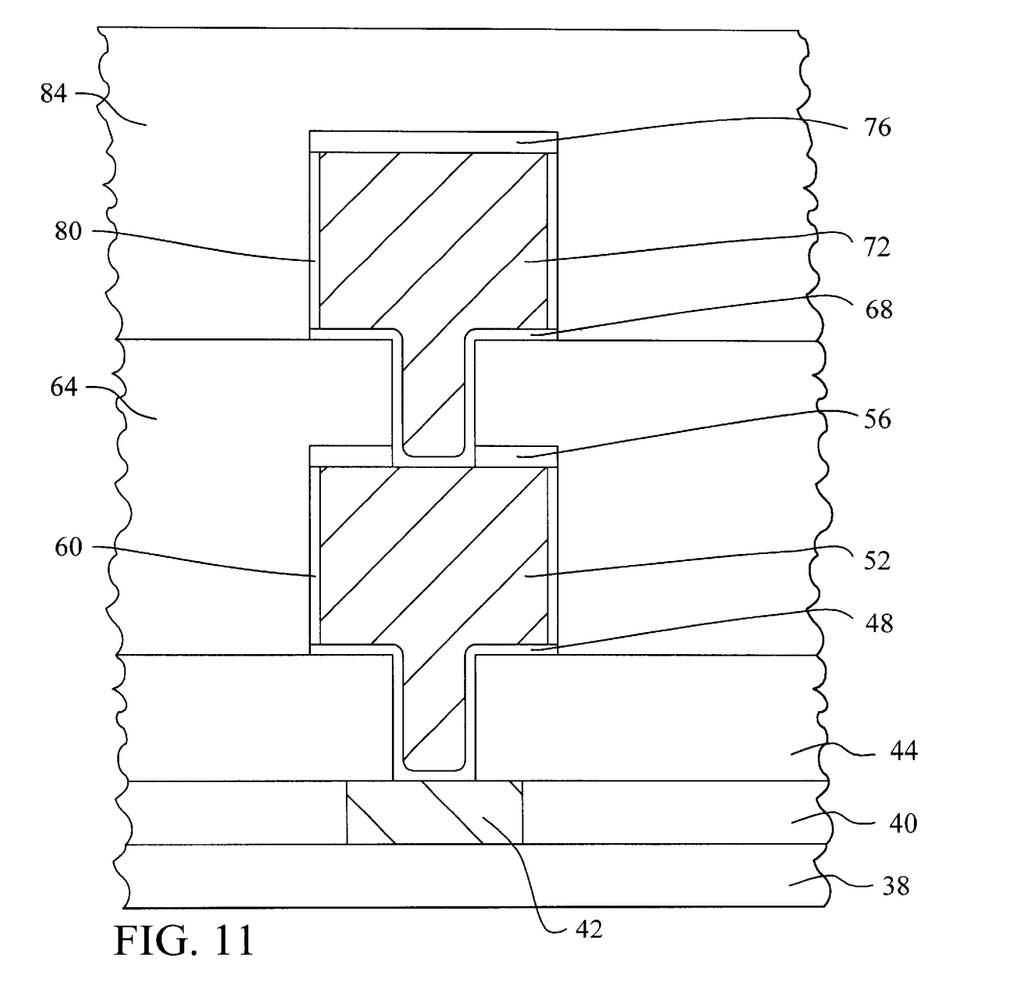

FIG. 11 illustrates how the process steps can be repeated to form subsequent levels of copper interconnections. After the via trench is etched in the second dielectric layer 64, a barrier layer 68 is deposited overlying the second dielectric layer 64. A thin copper seed layer, which is not shown, is deposited overlying the barrier layer 68 to prepare the surface for the copper layer 72 deposition. After copper layer 72 electrochemical deposition and anneal, the via trench is completely filled with copper. The dielectric barrier layer 76 is optionally deposited overlying the copper layer 72. The copper etch is performed. The copper-germanium passivation layer 80 is formed on the exposed surfaces of the copper layer. Finally, a final dielectric layer 84, such as plasma nitride, is deposited overlying the upper level conductive traces to complete the integrated circuit.

The process of the present invention provides a very manufacturable method for fabricating copper interconnects in the fabrication of an integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method to form copper interconnects in the manufacture of an integrated circuit device comprising:

providing a substrate layer encompassing all underlying layers, devices, junctions, and other features;

depositing a first dielectric layer overlying said substrate layer;

etching a via through said first dielectric layer;

depositing a barrier layer overlying said first dielectric layer and within said via;

depositing a copper layer wherein said copper layer overlies said barrier layer and fills said via; annealing said copper layer;

depositing a dielectric barrier layer overlying said copper layer after said step of depositing said copper layer;

thereafter etching through said dielectric barrier layer to said underlying copper layer to form a dielectric barrier layer hard mask overlying said copper layer;

patterning said copper layer and said barrier layer where exposed by said dielectric barrier layer hard mask;

forming a passivation layer composed of a copper-germanium alloy on the exposed surfaces of said copper layer wherein said passivation layer forms on sidewalls of said copper layer but does not form on top surface of said copper layer; and depositing a second intermetal dielectric layer overlying said dielectric barrier layer hard mask and said first dielectric layer to complete said copper interconnects in the manufacture of said integrated circuit device.

2. The method according to claim 1 wherein said barrier layer is composed of one of the group of titanium nitride (TiN), tantalum (Ta), and tantalum nitride (TaN).

3. The method according to claim 1 further comprising:

depositing a copper seed layer by physical vapor deposition (PVD) to a thickness of between about 200 Angstroms and 2,000 Angstroms overlying said barrier layer; and depositing said copper layer by electrochemical deposition.

4. The method according to claim 1 wherein said step of depositing said copper layer comprises one of the group containing: electrochemical deposition, chemical vapor deposition, and chemical vapor deposition.

5. The method according to claim 1 wherein said step of annealing said copper layer is performed at a temperature of between about 150 degrees C. and 400 degrees C. for between about 2 minutes and 30 minutes.

6. The method according to claim 1 wherein said step of etching through said copper layer and said barrier layer is accomplished by a reactive ion etching process.

7. The method according to claim 1 wherein said step of forming said passivation layer composed of said copper-germanium alloy on the exposed surfaces of said copper layer is by exposing said copper layer to one of the group comprising $GeH_4$ gas and $Ge_2H_6$ gas at a pressure of between about 5 Torr and 760 Torr and a temperature of between about 200 degrees C. and 400 degrees C.

8. The method according to claim 1 wherein said dielectric barrier layer comprises silicon nitride deposited to a thickness of between about 300 Angstroms and 2,000 Angstroms.

9. A method to form copper interconnect in the manufacture of an integrated circuit device comprising:

providing a substrate layer encompassing all underlying layers, devices, junctions, and other features;

providing conductive plugs in an isolation layer overlying said substrate layer;

depositing a first dielectric layer overlying said conductive plugs and said isolation layer;

etching through said first dielectric layer to said underlying conductive plugs wherein said first dielectric layer is not protected by a first mask and wherein said etching through forms via trenches;

depositing a barrier layer overlying said first dielectric layer and the exposed surfaces of said conductive plugs and within said via trenches;

depositing a thin copper seed layer overlying said barrier layer;

depositing a copper layer by electrochemical deposition wherein said copper seed layer initiates said copper layer deposition, wherein said copper layer overlies said barrier layer, and wherein said copper layer completely fills said via trenches; annealing said copper layer;

depositing a dielectric barrier layer overlying said copper layer after said step of depositing said copper layer;

thereafter etching through said dielectric barrier layer to said underlying copper layer to form a dielectric barrier layer hard mask overlying said copper layer;

etching through said copper layer and said barrier layer to said underlying first dielectric layer where said copper layer is not protected by said dielectric barrier layer hard mask and wherein said copper layer and said barrier layer are left overlying all of said via trenches;

forming a passivation layer composed of a copper germanium alloy on the exposed surfaces of said copper layer wherein said passivation layer forms on sidewalls of said copper layer but does not form on top surface of said copper layer; and depositing a second intermetal dielectric layer overlying said dielectric barrier layer hard mask and said first dielectric layer to complete said copper interconnects in the manufacture of the integrated circuit device.

10. The method according to claim 9 wherein said barrier layer is composed of one of the group of containing: titanium nitride (TiN), tantalum (Ta), and tantalum nitride (TaN).

11. The method according to claim 9 wherein said thin copper seed layer is formed by physical vapor deposition (PVD) to a thickness of between about 200 Angstroms and 2,000 Angstroms.

12. The method according to claim 9 wherein said step of depositing said copper layer by electrochemical deposition uses a copper containing solution comprising: $CUSO_4$ and organic chemicals.

13. The method according to claim 9 wherein said step of annealing said copper layer is performed at a temperature of between about 150 degrees C. and 400 degrees C. for between about 2 minutes and 30 minutes.

14. The method according to claim 9 wherein said step of etching through said copper layer and said barrier layer is accomplished by a reactive ion etching process.

15. The method according to claim 9 wherein said step of forming said passivation layer composed of said copper-germanium alloy on the exposed surfaces of said copper layer is by exposing said copper layer to one of the group comprising GeH4 gas and $Ge_2H_6$ gas at a pressure of between about 5 Torr and 760 Torr and a temperature of between about 200 degrees C. and 400 degrees C.

16. The method according to claim 9 wherein said dielectric barrier layer comprises silicon nitride deposited to a thickness of between about 300 Angstroms and 2,000 Angstroms.

17. A method to form copper interconnect in the fabrication of an integrated circuit device comprising:

providing a substrate layer encompassing all underlying layers, devices, junctions, and other features;

providing conductive plugs in an isolation layer overlying said substrate layer;

depositing a first dielectric layer overlying said conductive plugs and said isolation layer;

etching through said first dielectric layer to said underlying conductive plugs where said first dielectric layer is not protected by a first mask and wherein said etching through forms via trenches;

depositing a barrier layer comprised of one of the group of: titanium nitride (TiN), tantalum (Ta), and tantalum nitride (TaN) overlying said first dielectric layer and exposed surfaces of said conductive plugs and within said via trenches;

depositing a thin copper seed layer by physical vapor deposition overlying said barrier layer;

depositing a copper layer by electrochemical deposition wherein said copper seed layer initiates said copper layer deposition, wherein said copper layer overlies said barrier layer, and wherein said copper layer completely fills said via trenches;

annealing said copper layer;

depositing a dielectric barrier layer composed of silicon nitride overlying said copper layer;

etching through said dielectric barrier layer to said underlying copper layer where said dielectric barrier layer is not protected by a second mask and thereby forming a dielectric barrier layer hard mask overlying said copper layer;

etching through said copper layer and said barrier layer to said underlying first dielectric layer where said copper layer is not protected by said dielectric barrier layer hard mask and wherein said dielectric barrier layer hard mask, said copper layer, and said barrier layer are left overlying all of said via trenches;

forming a passivation layer composed of a copper-germanium alloy deposited in the exposed surfaces of said copper layer wherein said passivation layer forms on sidewalls of said copper layer but does not form on top surface of said copper layer; and depositing a second intermetal dielectric layer overlying said copper interconnects and said first dielectric layer to complete said copper interconnects in the manufacture of the integrated circuit device.

18. The method according to claim 17 wherein said step of depositing said copper layer by electrochemical deposition uses a copper containing solution comprising: $CuSO_4$ and organic chemicals.

19. The method according to claim 17 wherein said step of etching through said copper layer and said barrier layer is accomplished by a reactive ion etching process.

20. The method according to claim 17 wherein said step of forming said passivation layer composed of said copper-germanium alloy o the exposed surfaces of said copper layer is by exposing said copper layer to one of the group comprising $GeH_4$ gas and $Ge_2H_6$ gas at a pressure of between about 5 Torr and 760 Torr and a temperature of between about 200 degrees C. and 400 degrees C.

* * * * *